(12) United States Patent
Wu

(10) Patent No.: US 7,212,396 B2
(45) Date of Patent: May 1, 2007

(54) METHOD FOR FABRICATING A THIN FILM RESISTOR

(75) Inventor: Bing-Chang Wu, Taipei Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 10/072,339

(22) Filed: Feb. 7, 2002

(65) Prior Publication Data

US 2002/0084886 A1    Jul. 4, 2002

Related U.S. Application Data

(62) Division of application No. 09/653,108, filed on Aug. 31, 2000.

(30) Foreign Application Priority Data

Aug. 17, 2000    (TW) ..................... 89116610 A

(51) Int. Cl.
 *H01G 9/042*    (2006.01)

(52) U.S. Cl. .................. 361/309; 361/303; 361/311; 361/301.4; 361/306.1; 361/310; 361/328

(58) Field of Classification Search ............. 361/309, 361/303, 301.4, 306.1, 306.3, 311, 313, 328, 361/329, 330; 438/238, 384, 385, 382, 148, 438/149, 396, 528; 257/536, 538

See application file for complete search history.

(56) References Cited

U.S. PATENT DOCUMENTS

| 5,525,831 | A | * | 6/1996 | Ohkawa et al. |
| 5,656,524 | A | * | 8/1997 | Eklund et al. |
| 5,930,638 | A | * | 7/1999 | Reedy et al. |
| 6,001,663 | A | * | 12/1999 | Ling et al. |
| 6,069,063 | A | * | 5/2000 | Chang et al. |
| 6,069,398 | A | * | 5/2000 | Kadosh et al. |
| 6,096,584 | A | * | 8/2000 | Ellis-Monaghan et al. |
| 6,096,591 | A | * | 8/2000 | Gardner et al. |
| 6,100,138 | A | * | 8/2000 | Tu |
| 6,177,327 | B1 | * | 1/2001 | Chao |
| 6,429,068 | B1 | * | 8/2002 | Divakaruni et al. |

* cited by examiner

*Primary Examiner*—Dean A. Reichard
*Assistant Examiner*—Nguyen T. Ha
(74) *Attorney, Agent, or Firm*—J.C. Patents

(57) ABSTRACT

A method of fabricating high resistivity thin film resistors. An isolation region is formed on a substrate to isolate the active regions. A polysilicon layer is formed above the substrate. A diffusion barrier layer is formed above the polysilicon layer. Lightly doped ions are implanted in the polysilicon layer. The substrate is annealed at a high temperature. The diffusion barrier layer and the polysilicon layer are patterned to form a high-resistive thin film resistor. Spacers are formed on the sidewalls of the high-resistive thin film resistor.

7 Claims, 5 Drawing Sheets

METHOD FOR FABRICATING A THIN FILM RESISTOR

CROSS-REFERENCE TO RELATED APPLICATION

This application is a divisional application of, and claims the priority benefit, of U.S. application Ser. No. 09/653,108 filed on Aug. 31, 2000.

BACKGROUND OF THE INVENTION

1. Field of the Invention

The present invention generally relates to a method for fabricating a semiconductor device, and more particularly to a method for fabricating a thin film resistor.

2. Description of the Related Art

Resistors are devices used in mixed-mode integrated circuits. In terms of rectangular block resistors, resistance value (R) is in direct proportion to the length (L) of the rectangular block and is in inverse proportion to the cross-sectional area (A) of the rectangular block. Thus, resistance is calculated as $R=\rho(L/A)$ where $\rho$ is the resistivity of the material, L is the length of the resistor along the direction of the current and A is the cross sectional area of the resistor along the direction of the current.

In conventional practice, heavy dopants are applied to a portion designated as the bottom electrode of the transistor's capacitor and light dopants to a portion designated as the resistor on the same polysilicon layer. The top electrode of the capacitor and the gate electrode are formed on another polysilicon layers.

Lightly doped polysilicon thin film resistors are generally formed in the shape of a rectangle. Changing the doping concentration of the polysilicon layer allows the fabrication of resistors with different levels of resistivity. With the increased integration of semiconductor devices, requirements on the properties of materials used in semiconductor fabrication have also risen enabling devices to be formed in smaller dimensions with greater performance.

Polysilicon is the material used in the conventional method of fabricating thin film resistors. However, during the post-ion implantation annealing of high resistive polysilicon thin film resistors, doped material diffuses out increasing resistivity and lowering current flow, which makes it difficult to control the quality of the product. Additionally, the surface of the polysilicon layer may be oxidized during the subsequent thermal oxidation step reducing the effective dimension of the polysilicon layer. Moreover, the implanted dopants may also be consumed during the thermal oxidation causing imprecise resistivity of the thin film resistor.

FIGS. 1A–1D show the fabrication steps of a conventional high resistive, polysilicon thin film resistor and gate electrode. As shown in FIG. 1A, a shallow trench isolation region 102 is formed on a substrate 100 provided to isolate an active area 104. A polysilicon layer is deposited over the substrate using the chemical vapor deposition.

As shown in 1B, dopants 110, in the form of ions, are implanted into the polysilicon layer 106 to lower its resistivity.

As shown in 1C, after ion implantation 108 has been completed, the substrate is annealed in a chamber containing inert gas to restore the lattice structure and electrical type of the surface of the lightly doped polysilicon layer 106a causing the dopants implanted in the lightly doped polysilicon layer 106a to undergo thermal diffusion. Moreover, some of the dopants 110 will diffuse out increasing the resistivity of the lightly doped polysilicon layer.

As shown in FIG. 1D, the lightly doped polysilicon layer 106a is patterned to form a high resistive thin film resistor structure 106b above the shallow trench isolation region 102. This high resistive thin film resistor structure is an important part of the conventional, high resistive thin film resistor.

As shown in FIG. 1E, a thermal oxidation process is performed to form a gate oxide layer 112 on the substrate 100. The silicon oxide 116 is formed-on the surface layer of the high resistive thin film resistor structure during the thermal oxidation reducing the effective dimension of the high resistive thin film resistor 106b. Moreover, implanted dopants 110 are consumed. A patterned, doped polysilicon layer 114 is formed above the gate oxide layer 112. This patterned, doped polysilicon layer 114 serves as the gate layer for a metal oxide semiconductor transistor.

During the post-ion implantation annealing step described in the conventional practice above, dopants implanted in the polysilicon layer undergo a thermal diffusion. Consequently, some of the dopants diffuse out. Additionally, during the thermal oxidation step of the conventional practice described above, the surface of the lightly doped polysilicon layer oxidizes and becomes silicon oxide. As a result, the effective dimensions of the lightly doped polysilicon layer are changed. Moreover, during the process of thermal oxidation implanted dopants are consumed.

Thus, during the fabrication process of high resistive, polysilicon thin film resistors and gate electrodes, resistivity undergoes considerable change causing ineffective resistance.

SUMMARY OF THE INVENTION

It is therefore an object of the present invention to provide a method for fabricating a high-resistive thin film resistor that prevents implanted dopants from diffusing out or being consumed during subsequent stages in the fabrication process.

It is another object of the present invention to provide a method for fabricating a high-resistive thin film resistor that prevents oxidation on the surface of the polysilicon layer during the subsequent step of thermal oxidation. Thus, the effective dimensions of the polysilicon thin film resistor can be maintained.

In accordance with the foregoing and other objectives of the present invention, a method for fabricating a high-sensitive thin film resistor is provided, in which an isolation region is first formed on a substrate to isolate an active device. A polysilicon layer is formed above the substrate. A diffusion barrier layer is formed above the polysilicon layer. Lightly doped ions are implanted into the polysilicon layer. A post-ion implantation, high-temperature annealing process is performed on the substrate. The diffusion barrier layer and lightly doped polysilicon layer are patterned to form a high resistive, thin film resistor. Spacers are formed on the sidewalls of the thin film resistor.

In accordance with the method of the present invention for fabricating a thin film resistor, a diffusion barrier layer is formed above the thin film resistor. Moreover, spacers are formed on the sidewalls of the thin film resistor to raise resistivity.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incoporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1A:
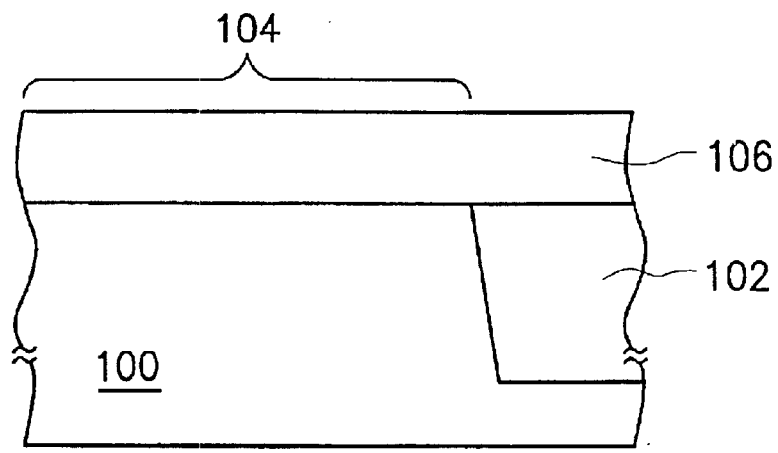
FIGS. 1A–1E are cross sectional views showing the processing steps for fabricating a conventional thin film resistor and gate electrode.
Figure 1B:
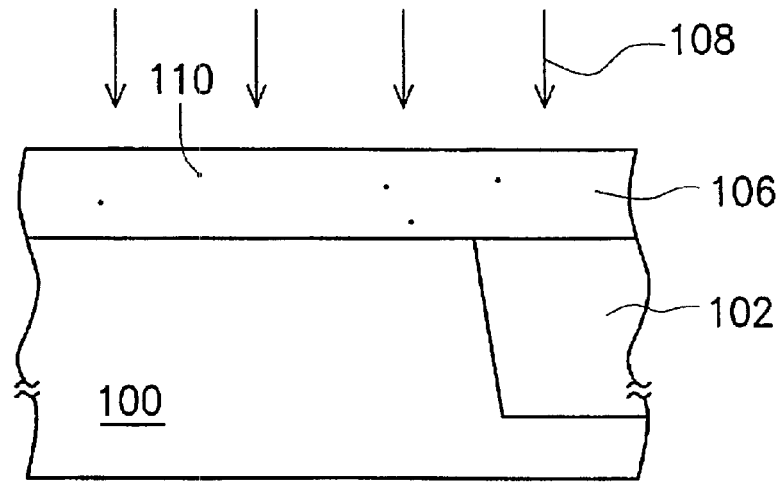
Figure 1C:
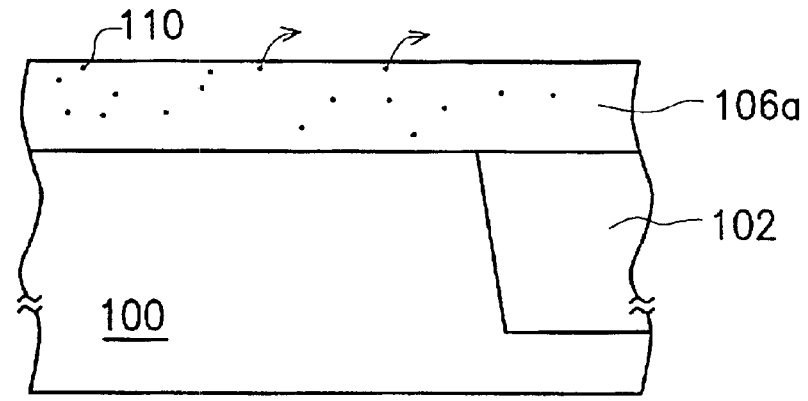
Figure 1D:
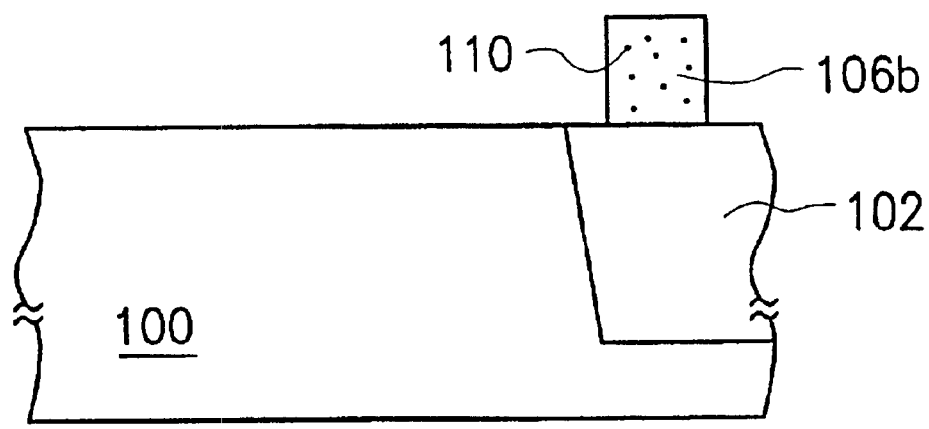
Figure 1E:
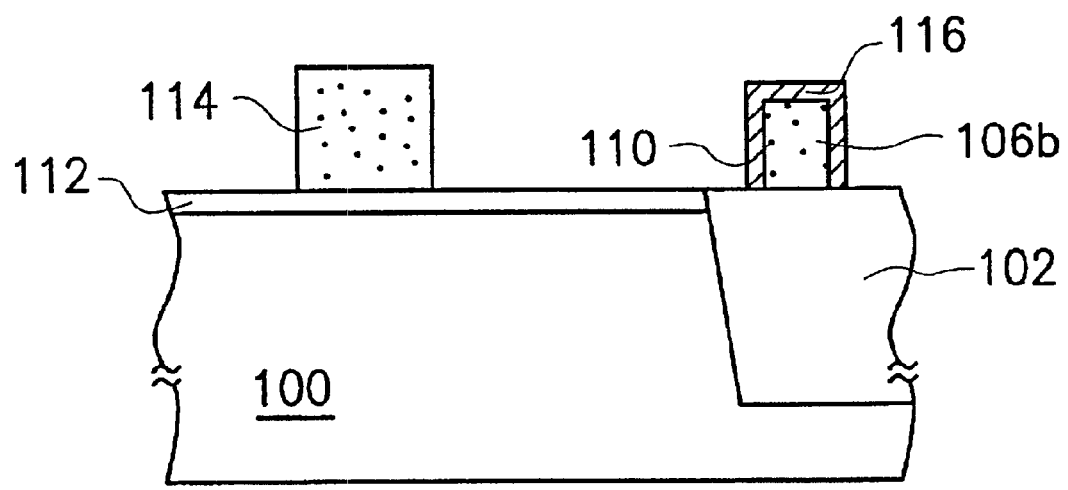

Reference will now be made in detail to the present preferred embodiments of the invention, examples of which are illustrated in the accompanying drawings. Wherever possible, the same reference numbers are used in the drawings and the description to refer to the same or like parts.

Figure 2A:
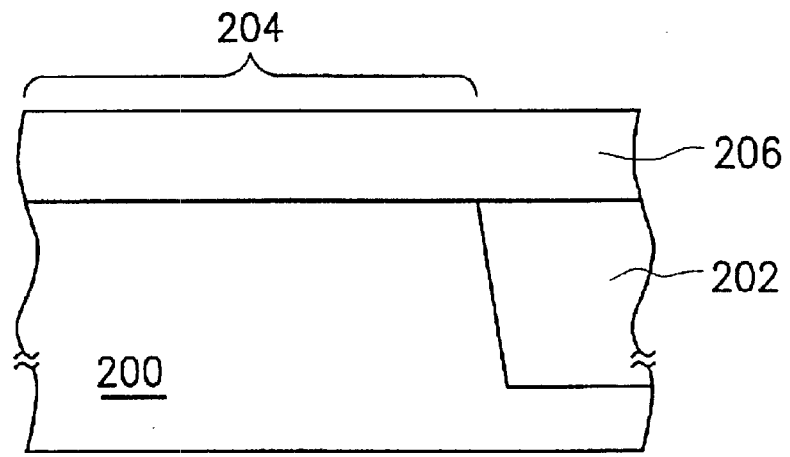
FIGS. 2A–2G are cross sectional views showing the processing steps for fabricating a thin film resistor according to one preferred embodiment of this invention.

Reference is now made to FIG. 2A where an isolation region 202 and an active region 204 are formed on a substrate 200 provided. The isolation region 202 separates the active regions. The isolation region can be, for example, a shallow trench isolation region. A polysilicon layer 206 is formed above the substrate 200. The method for forming polysilicon layer 206 can be, for example, the low pressure chemical vapor deposition method, and the thickness of the polysilicon layer 206 is preferably of about 2000 Angstroms.

Figure 2B:
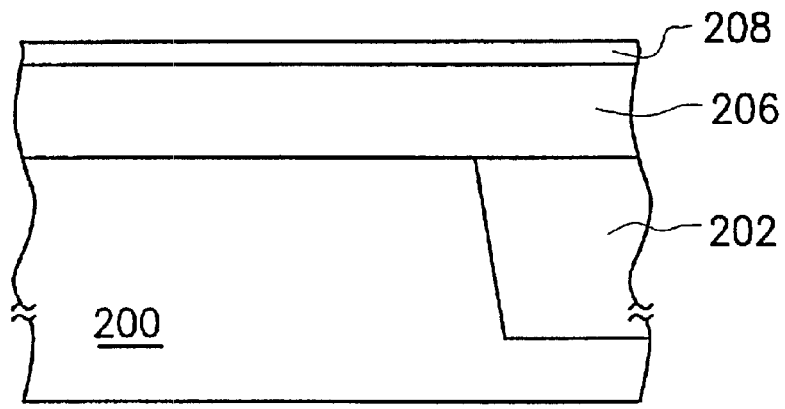

As shown in FIG. 2B, a diffusion barrier layer 208 is formed above the polysilicon layer 206. The material used to form the diffused layer can be an amorphous material with greater density such as silicon dioxide. The method for forming diffusion barrier layer 208 can be, for example, the low chemical vapor deposition method in which the deposited material has a preferable thickness of between 100 and 500 Angstroms. The amorphous silicon of silicon dioxide material is much denser which can prevent dopants from diffusing out of the polysilicon layer during the subsequent post-ion implantation process.

Figure 2C:
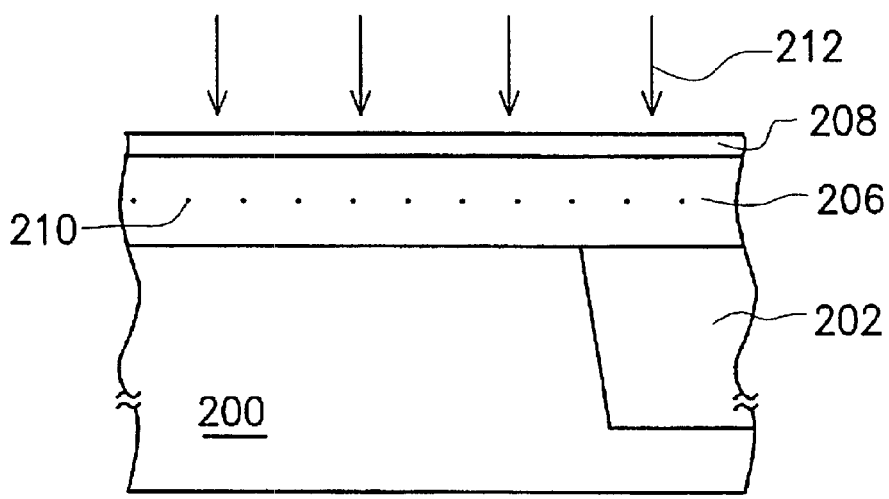

As shown in FIG. 2C, lightly doped ions are implanted into the polysilicon layer 206 to lower its resistivity. Dopants 210 can be for example boron, phosphorus or arsenic.

Figure 2D:
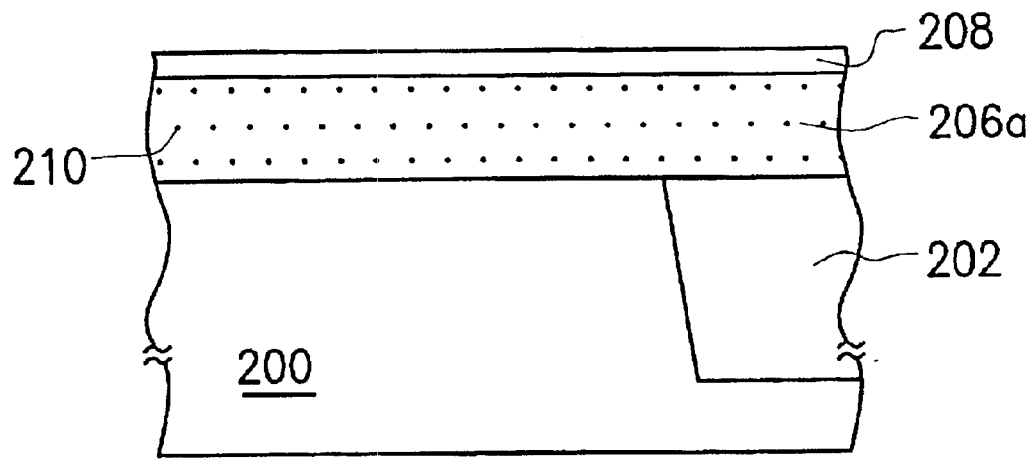
Figure 2E:
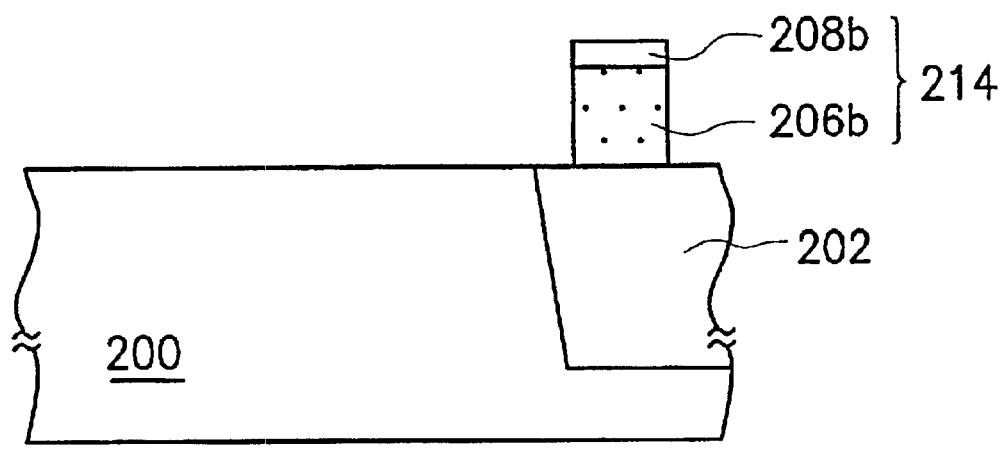
Figure 2F:
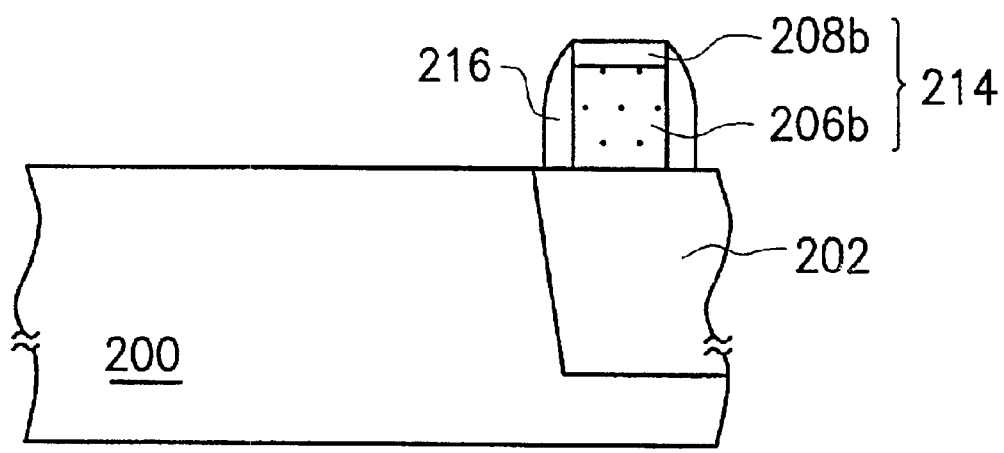

As shown in FIG. 2D, after the ion implantation step 212 is completed, the substrate 200 is annealed in a chamber containing inert gas which causes the thermal diffusion of implanted dopants 210 within the lightly doped polysilicon layer 206a. Because the diffusion barrier layer 208 is formed above the lightly doped polysilicon layer 206a, the diffusion of dopants can be prevented, which assures that dopants 210 are evenly diffused within the lightly doped polysilicon layer 206a.

As shown in 2E, the lightly doped polysilicon layer 206a and diffusion layer 208 are patterned to form a high resistive thin film resistor structure 214 above the isolation region 202. The high resistive thin film resistor structure 214 is a primary part of the thin film resistor. Moreover, the thin film resistor structure 214 is formed through the patterning of the lightly doped polysilicon layer 206b as well as the diffusion barrier layer 208b.

As shown in 2F, a conformal insulation layer is deposited over the substrate 200 (not shown in the figure). The insulation layer is etched back to form spacers 216 on the sidewalls of the high-resistive, thin film resistor structure 214. The material for the insulation layer can be silicon dioxide for example.

Figure 2G:
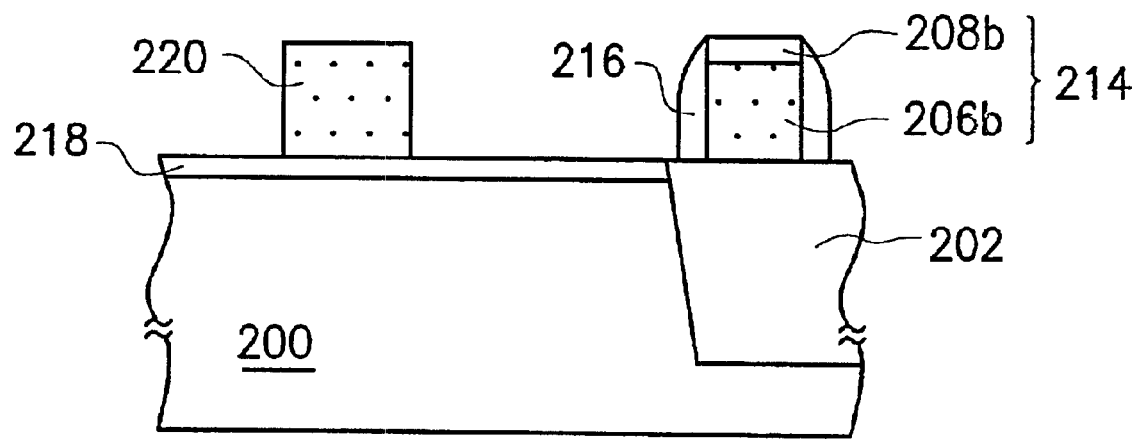

As shown in FIG. 2G, a gate electrode oxide layer 218 is formed above substrate 200. The method for forming the gate electrode oxide layer 218 can be for example the thermal oxidation. The gate electrode oxide layer 218 has a preferable thickness of between 100 and 250 Angstroms. A patterned, doped polysilicon layer 220 is formed above the gate electrode oxide layer 218. This patterned, doped polysilicon layer 220 serves as the gate electrode for a metal oxide semiconductor transistor. The method of forming the patterned, doped polysilicon layer can be the low-pressure chemical vapor deposition method, for example. The preferable thickness of the deposited material is about 2000 Angstrom.

Based on the foregoing, according to one preferred embodiment of the present invention, the high-resistive thin film resistor structures have the diffusion barriers which prevent dopants from diffusing out or being consumed during subsequent stages in the fabrication process.

Additionally, the present invention prevents oxidation on the surface of the polysilicon layer during the subsequent step of thermal oxidation. Thus, the effective dimensions of the polysilicon thin film resistor can be maintained.

The method of fabricating the thin film resistors according to one preferred embodiment of the present invention can be used to raise the degree of uniformity, stability and accuracy of the polysilicon thin film resistors while also maintaining the reliability of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high resistive thin film resistor structure comprising:

a substrate having an isolation region and an active region; a patterned, lightly doped polysilicon layer located on and in contact with the isolation region;

a diffusion barrier layer covering all the upper surface of the lightly doped polysilicon layer; and a spacer located on and in contact with the sidewalls of the lightly doped polysilicon layer and the barrier diffusion layer.

2. The structure of claim 1, wherein the isolation region includes a shallow trench isolation structure.

3. The structure of claim 1, wherein the thickness of the polysilicon layer is about 2000 Angstrom.

4. The structure of claim 1, wherein the diffusion barrier layer includes a silicon dioxide layer.

5. The structure of claim 4, wherein the silicon dioxide has a thickness of between 100 and 500 Angstrom.

6. The high resistive thin film resistor structure of claim 1, wherein the diffusion barrier layer covers an entire upper surface of the lightly doped polysilicon layer.

7. The high resistive thin film resistor structure of claim 1, wherein the spacer is in contact with the sidewalls of the lightly doped polysilicon layer and the barrier diffusion layer.

* * * * *